US006052021A

United States Patent [19]

Hieda

[11] Patent Number: 6,052,021

[45] **Date of Patent: *Apr. 18, 2000**

[54] SIGNAL PROCESSING INTEGRATED CIRCUIT HAVING FIRST AND SECOND BUFFERS EACH CONNECTED IN FIRST AND SECOND PATHS BETWEEN AN ANALOG SIGNAL PROCESSOR AND A DIGITIAL SIGNAL PROCESSOR TO PREVENT ABNORMAL CURRENT FLOW

[75] Inventor: Teruo Hieda, Yokohama, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/690,344

[22] Filed: Jul. 26, 1996

Related U.S. Application Data

[63] Continuation of application No. 08/186,542, Jan. 26, 1994, abandoned.

[30] Foreign Application Priority Data

Jan. 29, 1993 [JP] Japan .................................... 5-013559

[51] Int. Cl.[7] .................................................... H01L 25/00

[52] U.S. Cl. .......................... 327/565; 327/333; 327/566

[58] Field of Search .................................... 327/333, 565, 327/380, 50, 566, 552, 560, 356, 306, 141, 291; 358/312, 314, 336, 320; 341/136, 159, 172

[56] References Cited

U.S. PATENT DOCUMENTS

| | | | |
|---|---|---|---|
| 4,209,852 | 6/1980 | Hyatt | 365/222 |
| 4,220,932 | 9/1980 | Engel | 330/289 |
| 4,616,143 | 10/1986 | Miyamoto | 307/264 |
| 4,734,871 | 3/1988 | Tsunoda et al. | 364/557 |
| 4,827,159 | 5/1989 | Naganuma | 326/27 |
| 4,857,996 | 8/1989 | Hirano et al. | 348/250 |
| 4,859,871 | 8/1989 | Kobayashi et al. | 307/264 |
| 5,140,424 | 8/1992 | Yoshimura et al. | 348/620 |
| 5,146,112 | 9/1992 | Ito et al. | 307/303 |
| 5,153,730 | 10/1992 | Nagasaki et al. | 348/231 |
| 5,170,249 | 12/1992 | Ohtsubo et al. | 358/41 |
| 5,245,416 | 9/1993 | Glenn | 358/44 |
| 5,266,908 | 11/1993 | Koulopoulos et al. | 331/2 |
| 5,329,312 | 7/1994 | Bolsvert et al. | 348/256 |
| 5,343,352 | 8/1994 | Nagamine | 361/56 |
| 5,548,748 | 8/1996 | Fuse | 395/550 |

*Primary Examiner*—Kenneth B. Wells
*Attorney, Agent, or Firm*—Fitzpatrick, Cella, Harper & Scinto

[57] ABSTRACT

A signal processing apparatus is formed on a single semiconductor substrate and includes in a mixed relation an analog signal processing section and a digital signal processing section. A plurality of buffers are included on the substrate to buffer the respective sections from one another for preventing abnormalities such as circuit malfunctions, circuit failures, noise and excess current flow between the respective sections at power-on. The buffers are of different types according to the abnormality they are designed to prevent.

8 Claims, 4 Drawing Sheets

SIGNAL PROCESSING INTEGRATED CIRCUIT HAVING FIRST AND SECOND BUFFERS EACH CONNECTED IN FIRST AND SECOND PATHS BETWEEN AN ANALOG SIGNAL PROCESSOR AND A DIGITIAL SIGNAL PROCESSOR TO PREVENT ABNORMAL CURRENT FLOW

This application is a continuation of application Ser. No. 08/186,542 filed Jan. 26, 1994, now abandoned.

BACKGROUND OF THE INVENTION

1. Field of the Inventions

The present invention relates to signal processing apparatus for use with image sensing apparatus or the like, and more particularly to signal processing apparatus for processing analog and digital signals.

2. Description of the Related Art

Various methods for processing an output signal of an image sensing device such as a CCD are known.

For example, many methods of converting an output signal of an image sensing device into a digital signal by means of a high-speed analog/digital converter (hereinafter referred to as an AD converter) and then subjecting the resultant signal to digital signal processing have been proposed. More specifically, this type of method is arranged to effect AD conversion of a sensed color image signal, to execute signal processing required for an image sensing device, such as filtering, gamma conversion, matrix conversion and clipping, in a digital manner, and further to effect DA conversion by a high-speed digital/analog converter (hereinafter referred to as a DA converter) for producing a video signal.

In known image sensing devices using such digital signal processing, the circuits which were used in an analog form were simply replaced with corresponding circuits in a digital form. There have been accompanying problems such as device size or production cost cannot be reduced, as a result of a larger circuit scale, an increased number of parts, and a greater consumption of current.

Also, because digital circuits and analog circuits exist in a mixed relation, interference due to mixing of digital signals with analog signals presents an obstacle in obtaining a desired SN ratio or reduction of circuit size.

SUMMARY OF THE INVENTION

An object of the present invention is to solve the problems described above. Another object of the present invention is to prevent mixing of noise, a malfunction or circuit failure which would otherwise be caused when an analog signal processing section and a digital signal processing section are formed in a semiconductor integrated circuit in a mixed relation. To achieve those objects, the signal processing apparatus of the present invention includes a semiconductor integrated circuit in which an analog signal processing section for processing an analog signal, a digital signal processing section for transferring a signal between itself and the analog signal processing section and for processing a digital signal, and a buffer circuit disposed between the analog signal processing section and the digital signal processing section for preventing the occurrence of an abnormal signal upon power-on, are formed on a single semiconductor substrate.

With the present invention thus arranged, when an analog signal processing section and a digital signal processing section are formed in a semiconductor integrated circuit in a mixed relation, an abnormal current can be prevented from flowing upon power-on, making it possible to avoid a malfunction or failure of any circuit element. Other objects and features of the present invention will become apparent from the following description and the attached drawings.

DESCRIPTION OF THE PREFERRED EMBODIMENTS

Figure 1:
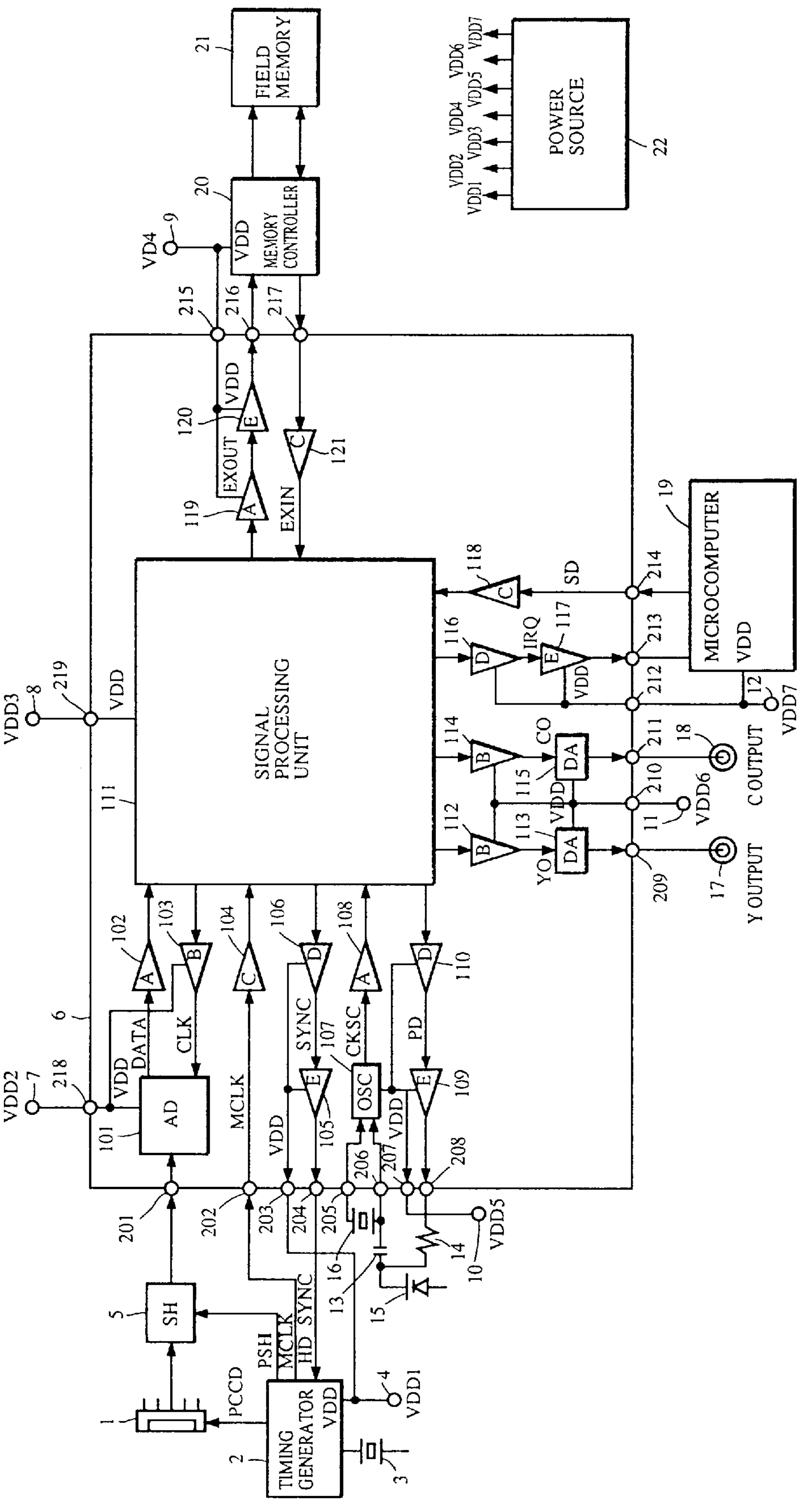
FIG. 1 is a circuit diagram of an embodiment of the present invention.
Figure 2A:
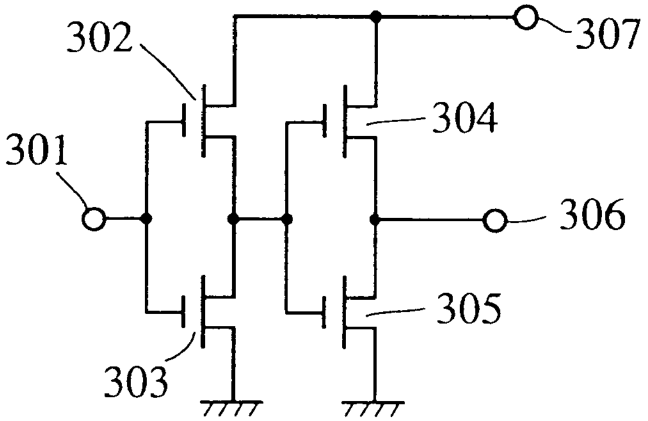
FIGS. 2(*a*) to 2(*e*) are circuit diagrams showing examples of A type to E type buffers used in the embodiment of the present invention shown in FIG. 1.
Figure 2B:
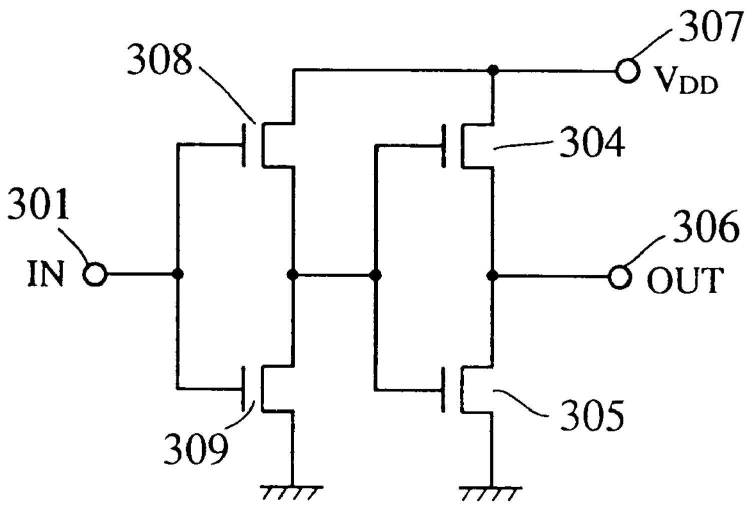
Figure 2C:
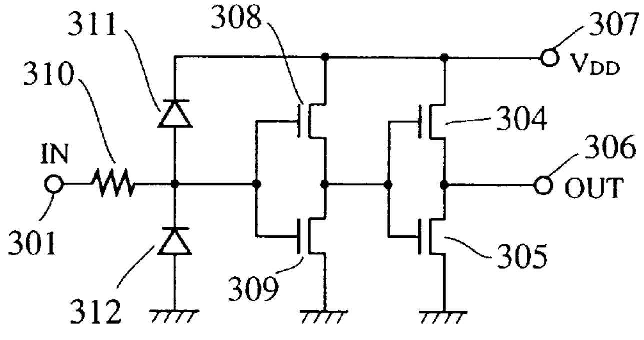
Figure 2D:
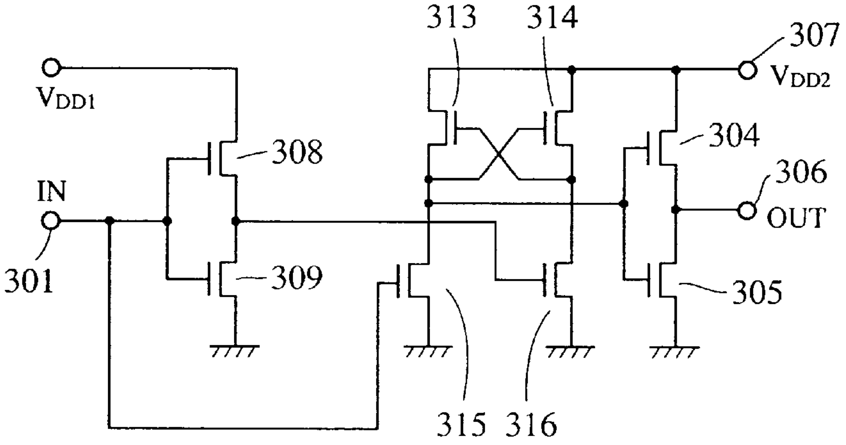
Figure 2E:
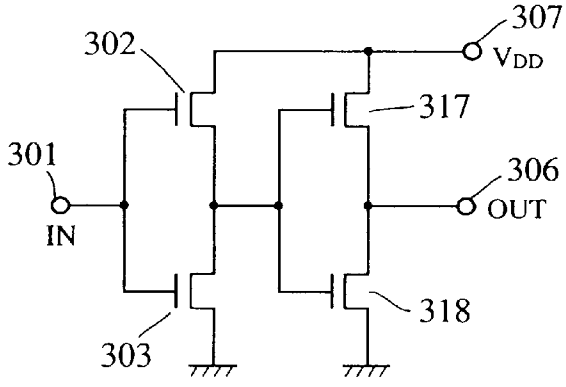

FIG. 1 shows one embodiment of the present invention.

Denoted by reference numeral 1 is a CCD which functions as an image sensing device, 2 is a timing generator for generating pulses adapted to drive the CCD, 3 is a quartz oscillator for generating reference clock pulses, 4, 7, 8, 9, 10, 11, 12 are source power terminals connected to a power source (described later), 5 is a sample and hold circuit for making an output signal of the CCD 1 continuous, and 6 is an integrated circuit which includes later-described circuits 101 to 121 and which has terminals 201 to 217, as shown. Also, 13 is a capacitor, 14 is a resistor, 15 is a variable capacity diode, 16 is a quartz oscillator for forming a signal having a frequency four times as high as that of a color sub-carrier wave, 17 is a luminance signal (Y) output terminal, 18 is a color signal (C) output terminal, 19 is a microcomputer for controlling the operation of the integrated circuit 6, 20 is a memory controller for receiving a digital video signal and for controlling a field memory to perform special modifications such as still, strobe (time-lapse) and so forth, 21 is a field memory for storing digital video signals of one frame, and 22 is a battery or a power source for producing various voltages required for the respective circuit elements.

Of the circuits 101 to 121 incorporated in the integrated circuit 6, 101 is an AD converter for effecting analog/digital conversion, and 102, 103, 104, 105, 106, 108, 109, 110, 112, 114, 116, 117, 118, 119, 120, 121 are buffers which are classified as five types, i.e., A type to E type, as illustrated. Also, 107 is an oscillator circuit, 111 is a signal processing unit for receiving a sensed digital image signal, executing such processes as color signal separation, filtering, gamma conversion, clipping and matrix conversion, and forming a digital luminance signal and color signals, and 113 and 115 are DA converters for effecting digital/analog conversion. Additionally, 201 to 217 are terminals of the integrated circuit 6.

The CCD 1 outputs a sensed image signal in accordance with a drive pulse generated by the timing generator 2, and the sensed image signal is made continuous by the sample and hold circuit 5 in accordance with a sample and hold pulse PSH which is also generated by the timing generator 2. An output of the sample and hold circuit 5 is applied to the AD converter 101 in the integrated circuit 6 via terminal 201 for conversion to a sensed digital image signal. The sensed digital image signal is applied via the buffer 102 to the signal processing unit 111 where it is subjected to such processes as color signal separation, filtering, gamma conversion, clipping and matrix conversion, so that a digital luminance signal and color signals are formed, as described above.

For the color signals, a clock signal CKSC, having a frequency four times as high as that of a color sub-carrier wave, is generated by a variable frequency oscillator which comprises the capacitor 13, the resistor 14, the variable capacity diode 15, the quartz oscillator 16 and the oscillator circuit 107. The clock signal CKSC is then input, the via buffer 108, to the signal processing unit 111 where balance modulation is performed by using the clock signal CKSC to form modulated color signals.

Further, the signal produced during the signal processing by signal processing unit 111 is input, as an external output signal EX·OUT, to the memory controller 20 via the buffers 119, 120 and the terminal 216. The memory controller 20 writes the input signal in the field memory 21, reads the stored signal, and further applies the stored signal to the signal processing unit 111 via the terminal 217 and the buffer 121 after adding the above-mentioned special modifications.

The digital luminance signal and color signals formed by the signal processing unit 111 are respectively applied to the DA converters 113 and 115 via the buffers 112 and 114, respectively, for digital/analog conversion, and are then output to a not-shown external device such as a TV monitor or VTR from the Y output terminal 17 and the C output terminal 18 via terminals 209 and 211, respectively.

A clock pulse MCLK which is generated in synchronism with the CCD operation by the timing generator 2 is input to the integrated circuit 6 via the terminal 202, and is then applied as an operating clock signal to the signal processing unit 111 via buffer 104. The clock signal is applied to the AD converter 101 via buffer 103 and to the DA converters 113 and 115 via a connection not shown. The signal processing unit 111 divides the frequency of the input clock signal at a predetermined ratio by a frequency divider incorporated therein, and outputs a synch signal SYNC to the timing generator 2 via the buffers 106 and 105 and the terminal 204. Also, the signal processing unit 111 compares the phase between SYNC and a signal obtained by dividing the frequency of the CKSC signal at a predetermined ratio, and outputs a compared result as a phase comparison signal PD to the resistor 14 via the buffers 110 and 109 and the terminal 208, whereby a Phase Locked Loop (PLL) for adjusting the CKSC frequency is established so as to keep the frequency relationship between the MCLK signal and the CKSC signal at a predetermined ratio.

Further, in order to control various circuit elements in the signal processing unit 111, an interrupt signal IRQ having a predetermined period (horizontal period H or vertical period V) is generated from the synch signal and is sent to the microcomputer 19 via the buffers 116, 117 and the terminal 213. Upon receiving the interrupt signal IRQ, the microcomputer 19 delivers predetermined setting data SD to the signal processing unit 111 via the terminal 214 and the buffer 118.

In FIG. 1, the buffers are classified as A to E type, as previously described.

Of the A to E type buffers, those which are indicated as having source power terminals use source power applied through the terminals; and the others which are indicated as not having source power terminals use power from the signal processing unit.

Characteristics of the A to E type buffers are as follows.

A: normal buffer;

B: high-speed buffer having a low threshold (a threshold for an input signal is set to be lower than the normal ½ VDD);

C: high-speed buffer having a low threshold (a threshold for an input signal is set to be lower than the normal ½ VDD and includes a protective circuit against an overvoltage);

D: buffer with built-in voltage conversion (a threshold for an input signal is set to be lower than the normal ½ VDD and a voltage conversion circuit is built in to prevent an operating current from increasing even when a low voltage is input);

E: buffer with output terminal driven (the buffer is constituted by a large-scale transistor which can drive a relatively large electrostatic capacitance and an output current at an output terminal or a circuit connected to the output terminal);

The type A buffer is connected between a preceding circuit and a subsequent circuit each of which is supplied with different power source voltage, respectively, while said type A buffer is not required to convert a signal level of an input signal.

The type B buffer is connected between a preceding circuit and a subsequent circuit. The preceding circuit is supplied with a power source voltage lower than that with which the subsequent circuit is supplied. The type B buffer is required to pass a relatively high speed signal.

The type C buffer is inseted in an input terminal.

The type D buffer is connected between a preceding circuit and a subsequent circuit. The preceding circuit is supplied with a power source voltage lower than that with which the subsequent circuit is supplied. The type B buffer is required to pass a relatively low speed signal.

The E type buffer is inserted in an output terminal.

The B and D type buffers are different in that the former buffers a high-speed signal and exhibits a larger consumption current. Accordingly, the B type buffer is inserted, as indicated by 103, in a line through which the main clock signal passes; and, as indicated by 112, 114, in lines through which the signal data passes. The D type buffer is inserted in lines through which the synch signal and the interruption signal passes, as indicated by 106, 110 and 116.

Power source voltages of various parts are set as follows. Since a CCD driving voltage is usually 5 V, a power source voltage VDD1 of the timing generator 2 is set correspondingly to 5 V. A power source voltage VDD2 of the AD converter 101 is set to 5 V since a conversion error can be reduced by using a relatively large voltage. For the same reason, a power source voltage VDD6 of the DA converters 113 and 115 is also set to 5 V. A power source voltage VDD5 of the oscillator circuit 107 is set to 5 V for increasing a gain to raise oscillation efficiency. A power source voltage VDD7 of the microcomputer 19 is set to 3–5 V corresponding to an operating voltage of the microcomputer used. A power source voltage VDD3 of the signal processing unit 111 is set to be as low as possible for reasons of reducing a consumption current, suppressing mixing of noise into the power source and lessening radiation noise. In practice, however, if the voltage is too low, the resulting operating speed would be so low as to make the operation unstable or disabled. Therefore, the power source voltage VDD5 is set to a lower limit of the normal operating range, e.g., 3–4.5 V. Finally, a power source voltage VDD4 of the memory controller 20 is set to the lowest required voltage, e.g., 3–4 V, for the reason of lowering a logical level of the digital signals EX·OUT and EX·IN to the extent possible, suppressing mixing of noise into the power source, and reducing radiation noise.

In accordance with the foregoing conditions, the respective power source voltages are set to meet the relationship expressed below in the form of formulae:

$5\ V = VDD1 = VDD2 = VDD5 = VDD6 > VDD3 \geqq VDD4$

Incidentally, as mentioned above, the power source voltage VDD7 is set to 3–5 V independent of the other power source voltages corresponding to an operating voltage of the microcomputer used.

At a junction where the power source voltage is possibly subjected to different levels or variations, the buffer which can output a higher voltage than an input level voltage is disposed so that variations in the power source voltage will not cause a speed reduction, deterioration of a waveform or a duty ratio, an increase in the consumption current or damage to transistors due to a penetration current, a failure in the operation, etc.

In this embodiment, in order to prevent a digital signal from mixing with an analog signal in the integrated circuit to produce noise between a block handling the analog signal and a block handling the digital signal, e.g., between the AD converter 101 and the signal processing unit 111, wiring and terminals of power sources are separately provided even for the same power source voltage when an integrated circuit is manufactured, so that wells or areas in which transistors are formed on a semiconductor substrate become separate between the two blocks. On this occasion, voltage variations may be temporarily caused in an IC upon power-on or the like. This may possibly give rise to inflow of an abnormal current via a signal line connecting the two blocks, thereby damaging a connected transistor or damaging the IC due to an excessive current flowing from the power source to ground caused by a latch-up phenomenon. To prevent such damage, in this embodiment, the buffer is inserted between any two blocks each of which is supplied with a different power source voltage, respectively regardless of variations in the power source voltages for the two blocks.

Taking into account of the above-discussed conditions, each type of buffer is inserted at a suitable position on the IC.

FIG. 2(*a*) shows one example of the A type buffer used in the embodiment of the present invention. As shown in FIG. 2(*a*) 301 is an input terminal, 302 and 304 are P-channel MOS transistors, 303 and 305 are N-channel MOS transistors, 306 is an output terminal and 307 is a power source terminal.

An input signal is applied to the gates of the transistors 302 and 303 via the input terminal 301 and, after being inverted, is applied to the gates of the transistors 304 and 305, thus producing an output signal at output terminal 306 after being again inverted.

Since the gate of each of the transistors 302 and 303 is insulated from its source and drain by the presence of an oxide film, a undesirable current will not flow so long as the input signal does not exceed a breakdown voltage (usually several tens of volts) of the oxide film. Accordingly, by using the buffer at a signal connection point as explained above, the operation of the integrated circuit is kept normal.

Further, by changing threshold voltages and other factors of the transistors 302 and 303 in FIG. 2(*a*), the buffers can be manufactured having different characteristics as mentioned above. For example, as shown in FIG. 2(*b*), the B type buffer is constituted to have a lower threshold for the input signal by replacing the transistor 302 in the arrangement of FIG. 2(*a*) with a PMOS transistor 308 which is obtained by making a mutual conductance gm of the transistor 302 relatively low, and the transistor 303 with an NMOS transistor 309 which is obtained by making a mutual conductance gm of the transistor 303 relatively high.

The mutual conductance of each transistor 302 and 303 can be varied by changing an aspect ratio of each gate of the transistor 308 and 309, or a thickness of the corresponding oxide film. As an alternative, the mutual conductance can also be changed by adjusting implantation of ions in the gate.

FIG. 2(*c*) shows an example of circuit arrangement of the C type buffer. This example is different from FIG. 2(*b*) in that a protective circuit comprising a resistor 310 and diodes 311 and 312 is added.

FIG. 2(*d*) shows an example of the D type buffer. This example is different from FIG. 2(*b*) in that PMOS transistors 313 and 314 and NMOS transistors 315 and 316 are additionally connected as illustrated. The transistors 313 and 314 constitute a bistable multivibrator and hence constitute a booster (voltage conversion circuit) in cooperation with the transistors 315 and 316. With such an arrangement, the operating current will not increase when a lower voltage is input.

Note that VDD1 represents a power source voltage VDD on the side of an input signal, and VDD2 represents a power source voltage VDD on the side of an output signal.

FIG. 2(*e*) shows an example of the E type buffer. This example is different from FIG. 2(*a*) in that a PMOS transistor 317 and an NMOS transistors 318 each having a larger gate area are used instead of the transistors 304 and 305, respectively.

Figure 3:
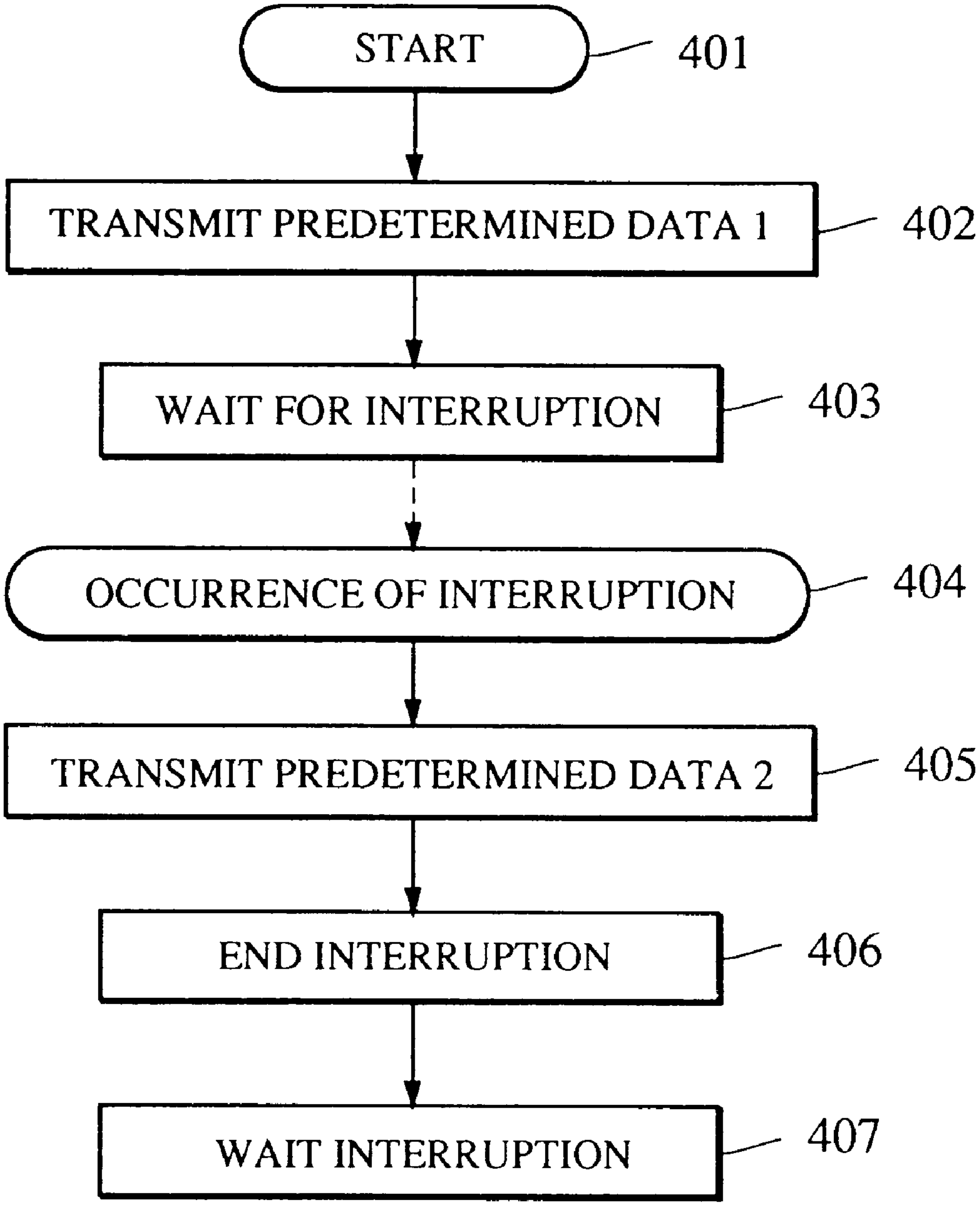
FIG. 3 is a flowchart of the operation of the microcomputer 19 shown in FIG. 1.

FIG. 3 is a flowchart showing the operation of the microcomputer 19 used in the embodiment of the present invention.

The process flow is started at 401, and predetermined data 1 which must be set before starting the operation, such as an operation mode and initial setting values, are transmitted at 402. Then, the microcomputer enters a standby state for interruption, where it waits for the occurrence of the aforesaid interrupt signal IRQ.

When the interrupt signal IRQ occurs, the process flow goes to 404 and then 405 where predetermined data 2 which are set from time to time, such as the gain of the color signals, are transmitted. After ending the interruption process at 406, the microcomputer waits for the occurrence of the interrupt again at 407.

By repeating the above operation, the microcomputer 19 executes various settings for the signal processing unit. While operations carried out after coming into the standby state for interruption at 403 and 407 are omitted here for brevity of the description, it is in practice possible to perform such operations as automatic exposure setting, automatic focusing, color temperature detection, and switch scan.

In the above embodiments, all the power source voltages are arranged to be supplied to the corresponding blocks separately from one another. However, those power sources which must not be separated from the standpoint of operation may be common to each other. In this case, those power source may be interconnected inside or outside of the integrated circuit 6. Further, in this case, a buffer inserted between the relevant blocks may have different characteristics from those mentioned above it may be omitted when the blocks, which can be essentially regarded as always at the same voltage, are interconnected.

Although a non-inverting buffer is inserted in the above embodiment, an inverting buffer (NOT) may be used. In this case, because signal logic is inverted, no changes are required for those lines in which two buffers are connected in series, e.g.; as represented by buffers 105 and 106, but such a process as inverting an output of a downstream D type FF, for example, is made for those lines in which only one buffer is inserted, e.g., as represented by buffers 102 and 103. Since a delay time per buffer is usually shorter in an inverting buffer than in a non-inverting buffer, the use of an inverting buffer is effective for increasing the speed of circuit operation.

The image sensing device is not limited to a CCD, but may be a MOSS, BASIS (Base Stored Image Sensor), or the like.

As described above, the present invention has the following advantages.

In an image sensing device, since power source voltages can be supplied easily by separating a section requiring a higher voltage from a section requiring a lower voltage, power comsumption can be reduced.

Since a block using an analog signal and a block using a digital signal are separately formed in an integrated circuit and power sources can also be separated correspondingly, deterioration of signals caused by the digital signal mixing with the analog signal through a integrated circuit board or power sources is suppressed.

Even when power source voltages are varied upon power-on or the like, an abnormal current is prevented from flowing between those blocks to which voltages at different levels are supplied. Accordingly, an integrated circuit will not be damaged by such an abnormal current.

At a junction where the power source voltage is possibly subjected to different levels or variations, it is possible to prevent a speed reduction, a deterioration of a waveform or duty cycle, an increase in the consumption of current or damage to transistors due to a penetration current, a failure in the operation, etc., which would otherwise be caused due to variations in the power source voltage.

Since an integrated circuit can be directly connected to other circuits without adding extra parts at the connecting portions therebetween, the packaging area becomes smaller and the number of parts is reduced, which results in higher reliability and lower cost.

Since the amplitude of a digital signal taken out of an integrated circuit can be reduced, the influence of the digital signal upon inputs to the integrated circuit, a sample and hold circuit and other analog circuits packaged in the same board can also be reduced.

Since the level of signals transferred to a microcomputer can be changed depending on an operating voltage of the microcomputer, no problems are raised in operation even when the same circuit is connected to a different microcomputer, or when one microcomputer is replaced with another microcomputer.

What is claimed is:

1. A signal processing integrated circuit comprising:

a) analog signal processing means for processing an analog signal;

b) digital signal processing means for transmitting first signals to and receiving second signals from said analog signal processing means through a first path and a second path, respectively, and for processing a digital signal, said first and second paths extending between said analog signal processing means and said digital signal processing means, said analog signal processing means and said digital signal processing means each including transistors which are formed on a common substrate of said integrated circuit;

c) power supply wiring and terminals for separately supplying power to said analog signal processing means and to said digital signal processing means so that said analog and digital processing means transistors are powered at separate terminals while respective predetermined power source voltages are supplied to each of said analog signal processing means and said digital signal processing means; and d) first buffer means connected in said first path between said digital signal processing means and said analog signal processing means and second buffer means connected in said second path between said analog signal processing means and said digital signal processing means, said buffer means being constructed to prevent current which is greater than a given magnitude from flowing through said paths at least upon the application of power source voltages to said power supply wiring and terminals.

2. A signal processing integrated circuit according to claim 1, wherein said analog signal processing means includes an AD converter.

3. A signal processing intergrated circuit according to claim 1, wherein said digital signal processing means comprises a DA converter.

4. A signal processing intergrated circuit according to claim 1, wherein said first buffer means comprises a plurality of transistors.

5. A signal processing integrated circuit according to claim 1, wherein said digital signal processing means includes a digital signal output terminal through which a digital signal from said digital signal processing means is output to a peripheral circuit outside said signal processing integrated circuit.

6. A signal processing intergrated circuit according to claim 5, wherein said peripheral circuit is a microcomputer.

7. A signal processing intergrated circuit according to claim 5, wherein said peripheral circuit is a memory unit.

8. A signal processing integrated circuit according to claim 5, further including a third buffer means which is connected between said digital signal output terminal and said digital signal processing means and which comprises transistors having larger gate areas than gate areas of at least one of the transistors included in said second buffer means.

* * * * *

UNITED STATES PATENT AND TRADEMARK OFFICE

CERTIFICATE OF CORRECTION

PATENT NO. : 6,052,021

DATED : April 18, 2000

INVENTOR(S) : TERUO HIEDA

It is certified that error appears in the above-identified patent and that said Letters Patent is hereby corrected as shown below:

COLUMN 3:

Line 8, "the via" should read --via the--.

COLUMN 4:

Line 25, "inseted" should read --inserted--.

COLUMN 5:

Line 34, "of" should be deleted; and
Line 49, "a" s;hould read --an--.

COLUMN 6:

Line 22, "transistors 318" should read --transistor 318--;
Line 53, "source" should read --sources--;
Line 55, "may have" should read --having--; and
Line 63, "series, e.g.;" should read --series; e.g.,--.

UNITED STATES PATENT AND TRADEMARK OFFICE
CERTIFICATE OF CORRECTION

PATENT NO. : 6,052,021

DATED : April 18, 2000

INVENTOR(S) : TERUO HIEDA

It is certified that error appears in the above-identified patent and that said Letters Patent is hereby corrected as shown below:

COLUMN 7:

Line 17, "a" should read --an--.

Signed and Sealed this

Seventeenth Day of April, 2001

Attest:

NICHOLAS P. GODICI

Attesting Officer

*Acting Director of the United States Patent and Trademark Office*